(12) United States Patent
Confalonieri

(10) Patent No.: US 8,130,550 B1
(45) Date of Patent: Mar. 6, 2012

(54) MEMORY WITH SUB-BLOCKS

(75) Inventor: Emanuele Confalonieri, Milan (IT)

(73) Assignee: Micron Technology, Inc., Boise, ID (US)

( * ) Notice: Subject to any disclaimer, the term of this patent is extended or adjusted under 35 U.S.C. 154(b) by 330 days.

(21) Appl. No.: 12/491,160

(22) Filed: Jun. 24, 2009

(51) Int. Cl.
*G11C 11/34* (2006.01)

(52) U.S. Cl. ......... 365/185.11; 365/185.29; 365/189.05; 365/189.08; 365/195; 365/230.01; 365/230.03; 365/230.06; 365/231

(58) Field of Classification Search ............. 365/185.11, 365/185.29, 189.05, 189.08, 195, 230.01, 365/230.03, 230.06, 231
See application file for complete search history.

(56) References Cited

U.S. PATENT DOCUMENTS

| | | | |
|---|---|---|---|
| 2007/0070703 A1* | 3/2007 | Tran et al. ................ | 365/185.22 |
| 2008/0059692 A1* | 3/2008 | Erez .............................. | 711/103 |
| 2008/0137409 A1* | 6/2008 | Nakamura et al. ......... | 365/185.2 |
| 2008/0301256 A1* | 12/2008 | McWilliams et al. ........ | 709/214 |
| 2010/0050053 A1* | 2/2010 | Wilson et al. ................ | 714/773 |

* cited by examiner

*Primary Examiner* — Fernando Hidalgo
(74) *Attorney, Agent, or Firm* — Schwegman, Lundberg & Woessner, P.A.

(57) ABSTRACT

A non-volatile memory comprising a NOR block with a first sub-block independently addressable from a second sub-block, the two sub-blocks sharing a physical substrate of the NOR block, and a first memory to store execution status information to reflect an erase status of the first sub-block. A method to selectively erase the first sub-block while inhibiting the second sub-block from erasing, comprising updating execution status information associated with the first sub-block and resuming erasing upon an occurrence of an interruption event depending on the indication of the execution status information.

20 Claims, 6 Drawing Sheets

MEMORY WITH SUB-BLOCKS

TECHNICAL FIELD

The present invention relates to integrated circuits including memory and more specifically a non-volatile memory.

BACKGROUND OF THE INVENTION

Memory storage capability in integrated circuits is usually provided by memory elements, or memory cells, organized in arrays. The total storage capacity can be further divided in smaller sized arrays, or physical blocks, depending on the memory technology and/or on the programming and erasing mechanisms.

For example, NOR-type flash memories often have two or more physical memory blocks. These physical blocks are physically separated from each other and may be operated selectively. As an example, it is possible to access and read a physical block while the data in a different block is being changed. In order to ensure independent operation each physical block must be provided with appropriate decoding circuitry to ensure electrical insulation between the physical blocks. Both separation and local decoding circuitry space lead to an increased overall cost.

BRIEF DESCRIPTION OF THE DRAWINGS

The features and advantages of the present invention will be made apparent by the following detailed description of some embodiments thereof, illustrated merely by way of non-limiting examples in the annexed drawings, wherein.

DETAILED DESCRIPTION

Figure 1:
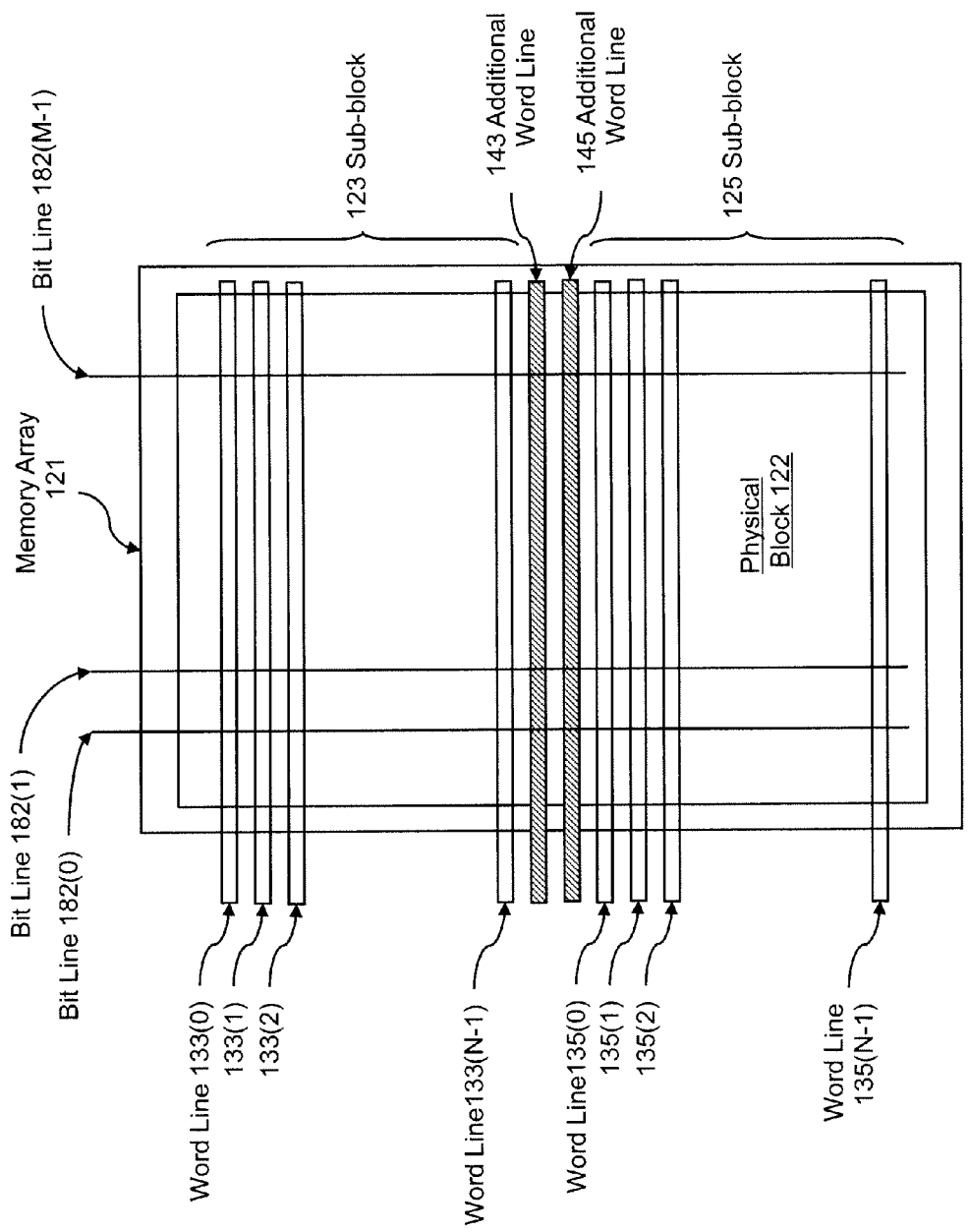
FIG. 1 is a schematic view of the memory array according to one embodiment of the invention with two sub-blocks.

FIG. 1 is a schematic view of a memory array according to an embodiment of the invention. The memory array 121 includes a single physical block 122 of 2N Word Lines and M Bit Lines for a total of 2×N×M memory cells, as shown. Of course, other word lines and bit line configuration may be used. The single physical block 122 is divided in two portions: a first sub-block portion 123 and a second sub-block portion 125, each of which includes N Word Lines and M Bit Lines (for a total of N×M memory cells per sub-block). In the illustrated array, each sub-block portion 123, 125 is accessible. In order to be clearer, at times this description may refer to these sub-block portions as "virtual blocks" because they appear to the end user to be identical to two physically separate blocks even though they are not.

The storage capacity of each sub-block portion is the same as the storage capacity of a physical block in an equivalent device made with existing technology. Additionally, the external addresses are compatible with existing products.

From the user's point of view, the first and second sub-block portions 123 and 125 may be operated independently from each other even though they are within the same physical block 122. The internal organization of the memory in the integrated circuit is completely transparent to the user when addressing a memory cell for reading or programming a block of memory cells.

Memory cells in each sub-block portion are organized into rows (Word Lines) and columns (Bit Lines). In FIG. 1, memory cells on Word Lines 133(0) to 133(N−1) and on Bit Lines 182(0) to 182(M−1) make up the first sub-block portion 123. Memory cells on Word Lines 135(0) to 135(N−1) and Bit Lines 182(0) to 182(M−1) make up the second sub-block portion 125.

Memory cells may be erased by applying a voltage differential across the Word Lines 133 and the underlying substrate or across the Word Lines 135 and the underlying substrate (reference to underlying substrate here is made to the P-well hosting the channel of the memory cell; such a P-well may be completely surrounded by a N-well within the chip's substrate, and therefore is insulated from it). This operation may be performed simultaneously for all memory cells within an addressed sub-block by selectively applying this erase voltage to addressed Word Lines 133(0) to 133(N−1) or to Word Lines 135(0) to 135(N−1) respective to the common underlying substrate, but not to the Word Lines of an unaddressed sub-block (i.e., not to Word Lines 135(0) to 135(N−1) or not to Word Lines 133(0) to 133(N−1) respectively). For example, sub-block 123 may be erased by applying voltage to each of its Word Lines while applying erase differential voltage to the undying substrate. If the Word Lines of sub-block 125 are not biased in a similar way, they will not be erased. This is a significant advantage over prior systems in which the entire physical block had to be erased.

The voltage differential between what is applied to the Word Line(s) and underlying substrate varies by process technology. As an example, a negative voltage of about −11 to −5V may be applied to the Word Lines and a positive voltage of about +5 to +11V may be applied to the underlying substrate. The erasing voltage differential need not be applied in a box-like time pattern and may be varied during the erase operation in a ramp- or staircase-fashion on one or both the electrodes that is Word Lines and/or underlying substrate. The underlying substrate may be the isolated well where the memory array is or the common substrate of the chip.

In an embodiment of the invention, a positive inhibition voltage is applied to the Word Lines of the unaddressed sub-block to avoid or reduce any electrical disturbance to those memory cells. This inhibition voltage may be the same as the voltage applied to the substrate (i.e., +5 to +11V), so as to minimize the overall voltage differential on the memory cells on these unaddressed Word Lines.

Each sub-block is the smallest memory entity that may be erased without affecting data stored in memory locations outside of the sub-block itself. This allows compatibility with existing devices.

As illustrated, additional memory cells within the physical block 122 store additional information, e.g., (execution status information) in relation to the sub-block portion status during the execution an erase command or to other functionality of the integrated circuit, and are not available to the user for data storage.

In the illustrated embodiment, additional Word Lines 143 and 145 store this information. The additional Word Line 143 is associated with the first sub-block 123 and the additional Word Line 145 is associated with the second sub-block 125. There may be more than one additional Word Line associated with each sub-block or an additional Word Line may be shared by one or more sub-blocks.

The additional Word Lines 143 and 145 may be physically the same as the other Word Lines 133 and 135 of the sub-blocks 123 and 125, or may be physically different. For example, only a subset of the memory cells in Word Lines 143 and 145 may be connected to Bit Lines, depending on the amount of additional information to be stored therein.

The exact position of additional Word Lines 143 and 145 within the single physical block 122 may be different in different embodiments. In one embodiment, they are located in a region separating the Word Lines 133,135 defining the sub-blocks 123 and 125, as it is shown in FIG. 1. However, in different embodiments, they are located elsewhere, such as at the top or at the bottom of each group of Word Lines defining the sub-blocks 123 and 125, etc.

In another embodiment, the additional memory cells are located in a portion of an integrated circuit (not shown in FIG. 1) different from the memory array 121, such as in a different memory array, or in a portion of the memory array dedicated to this purpose.

Of course there may be any number of sub-blocks, such as four or eight and need not be a power of two.

Figure 2:
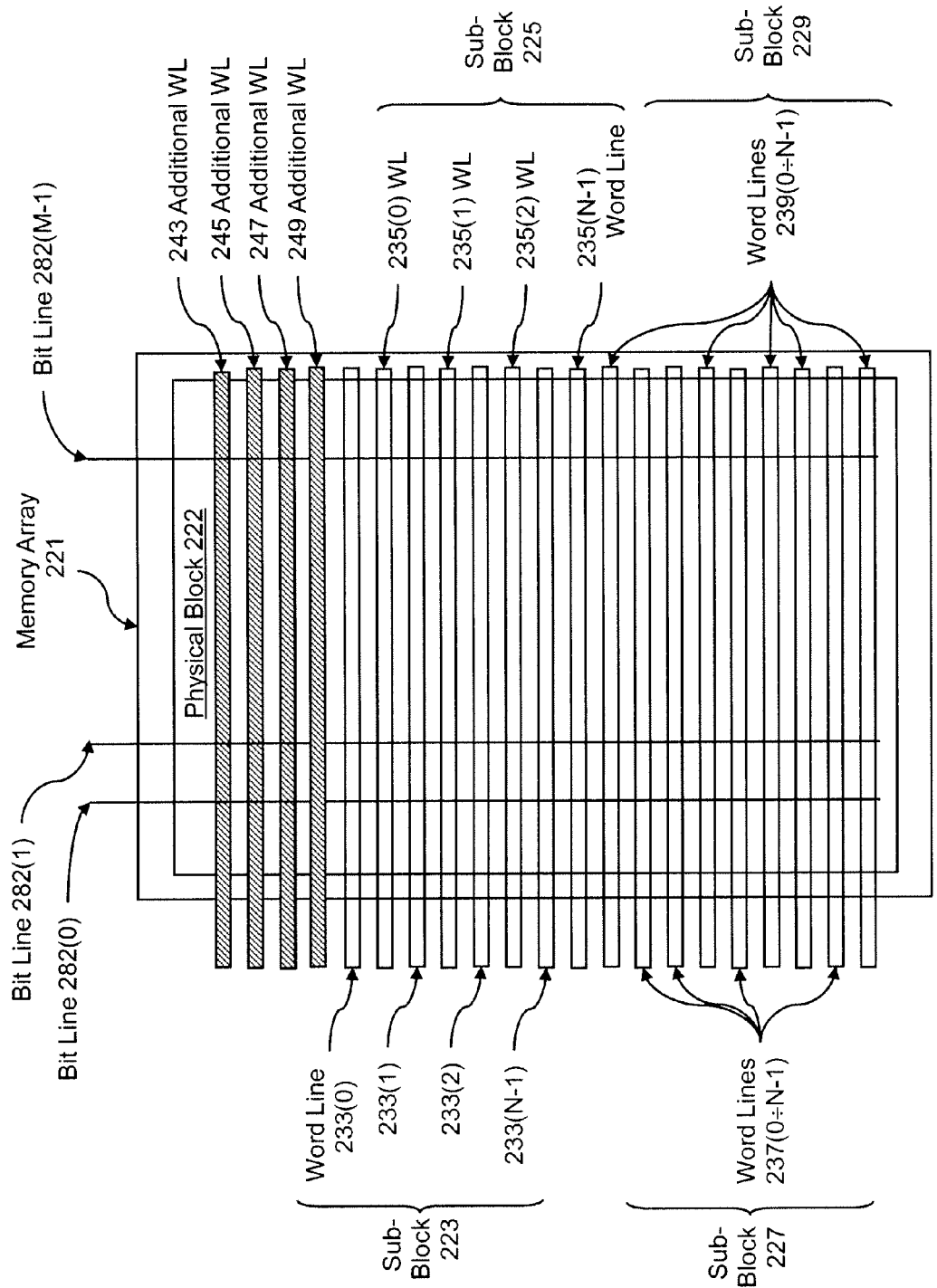
FIG. 2 is a schematic view of the memory array according to another embodiment of the invention with more than two sub-blocks.

FIG. 2 illustrates an embodiment featuring a memory array 221 including a single physical block 222 having 4N Word Lines and M Bit Lines for a total of 4×N×M memory cells.

The single physical block 222 is logically divided into four portions respectively defining a first sub-block 223, a second sub-block 225, a third sub-block 227, and a fourth sub-block 229 each of which includes N Word Lines and M Bit Lines (for a total of N×M memory cells per sub-block). In FIG. 2 memory cells on Word Lines 233(0) to 233(N−1) and on Bit Lines 282(0) to 282(M−1) define the first sub-block 223 containing N×M memory cells. Memory cells coupled to Word Lines 235(0) to 235(N−1) and to Bit Lines 282(0) to 282(M−1) define the second sub-block 225 also containing N×M memory cells. Memory cells on Word Lines 237(0) to 237(N−1) and on Bit Lines 282(0) to 282(M−1) define the third sub-block 227 also containing N×M memory cells. Memory cells laying on Word Lines 239(0) to 239(N−1) and on Bit Lines 282(0) to 282(M−1) define the fourth sub-block 229 also containing N×M memory cells.

Even if in an embodiment each sub-block contains adjacent Word Lines, the relative position of Word Lines defining different sub-blocks can be arbitrarily chosen. For example in FIG. 2 Word Lines 233 and 235 are alternating each other, while Word Lines 237 and 239 are randomly distributed; the latter case is particularly interesting for those products requiring a higher level of security against intrusion and tampering. The de-scrambling of Word Line address is performed in the Word Line decoding circuitry (not shown) according to conventional techniques.

As illustrated in the example of FIG. 2, additional Word Lines 243, 245, 247 and 249 are in the single physical block 222 to accommodate additional memory cells and respectively related to first sub-block 223, to second sub-block 225, to third sub-block 227 and to fourth sub-block 229. The additional memory cells are used to store additional information, e.g. about the status of the device during operation as described below, or other information such as the number of program erase cycles or the like. The additional memory cells are not available to the user. The additional Word Lines in the example of FIG. 2 are placed at one end of the physical block 222, but they may be arbitrarily located in the array.

In another embodiment the additional memory cells are in a different region of the integrated circuit.

In an embodiment the sub-blocks are of different size from each other, for example the storage capacity may be 512 Kbit for one sub-block and 16 Kbit for one other sub-block.

In one embodiment the number and/or the size of sub-block or even the scrambling may be changed during the life of the integrated circuit by appropriately redefining the correspondence between logical address provided by the user and Word Line address in the sub-block memory array so as to map the new configuration. For this purpose mapping means are associated to the Word Lines in each sub-block, for example including a correspondence table between logical address and physical address; such means are suitable to be up-dated and modified from time to time in response to a received command in order to establish a new correspondence table and therefore define a new set of sub-blocks for either size and/or location. In one embodiment featuring a variable number of sub-blocks during the life of the device, care must be paid to maintaining at least a set of additional memory cells associated to each sub-block to store the corresponding necessary additional information. This feature allows increased flexibility in the management of the memory according to changing configuration requirements with respect to initial product specifications.

A method to operate the integrated device according to an embodiment is now described in detail in the case of a NOR memory device.

Programming or reading a data into or from any addressed memory cell is performed by appropriately biasing the Word Line and the Bit Line of the addressed memory cell according to conventional programming or reading conditions. This allows the above described devices to be compatible with existing devices. Erasing of data from a memory cell is obtained by selectively applying a differential voltage between the Word Line of the memory cell belonging to the addressed sub-block and the underlying substrate. All Word Lines in the addressed sub-block are selected through the Word Line decoding circuitry (not illustrated) with the appropriate de-scrambling, if necessary. The minimum addressable unit during an erase operation is a sub-block. The data stored in the other sub-blocks remains unchanged.

Typical erase biasing conditions include a negative voltage of about −11 to −5V (i.e., −8V) applied to the Word Lines and a positive voltage of about +5 to +11V (i.e., +8V) applied to the underlying substrate creating a differential of 10 to 22V. The erasing voltage need not be applied in a box-like time pattern and may be varied during the erase operation in a ramp- or staircase-fashion on one or both the electrodes. Such erase biasing conditions are also applied to the additional memory cells on the additional Word Lines related to the addressed sub-block, so for example, with reference to FIG. 2, while erasing sub-block 223 memory cells on additional Word Line 243 are also erased.

These biasing conditions may cause an electrical disturbance to the memory cells of other sub-blocks and corresponding additional Word Lines sharing the same substrate with the addressed sub-block. To avoid or limit such a disturbance an inhibition voltage may be applied to Word Lines of the unaddressed sub-blocks and to the unaddressed additional Word Lines so as to cancel or to substantially reduce the voltage differential with respect to the underlying substrate. In the example above (erasing of sub-block 223 and additional Word Line 243), Word Lines of sub-blocks 225, 227, and 229 and related additional Word Lines 245, 247, and 249 are inhibited from erasing thought the use of an inhibition voltage during the erasure of sub-block portion 223. In one embodiment such an inhibition voltage is a positive voltage, such as +1.8 to +3.3V. In another embodiment, the inhibition voltage is the same as the voltage applied to the underlying substrate which therefore minimizes electrical disturbances on memory cells in unaddressed Word Lines. The sub-blocks may therefore be operated independently from each other without affecting the data stored in other sub-blocks sharing the same physical block.

Several events may cause the interruption of the erase flow during execution, such as an erase suspend command or a power-loss event leading to an uncontrolled power down of the integrated circuit. These events are handled through the use of Execution Status Information (ESI) as discussed below. The status is updated at several different stages, so that the flow may be recovered at any time.

Figure 3:
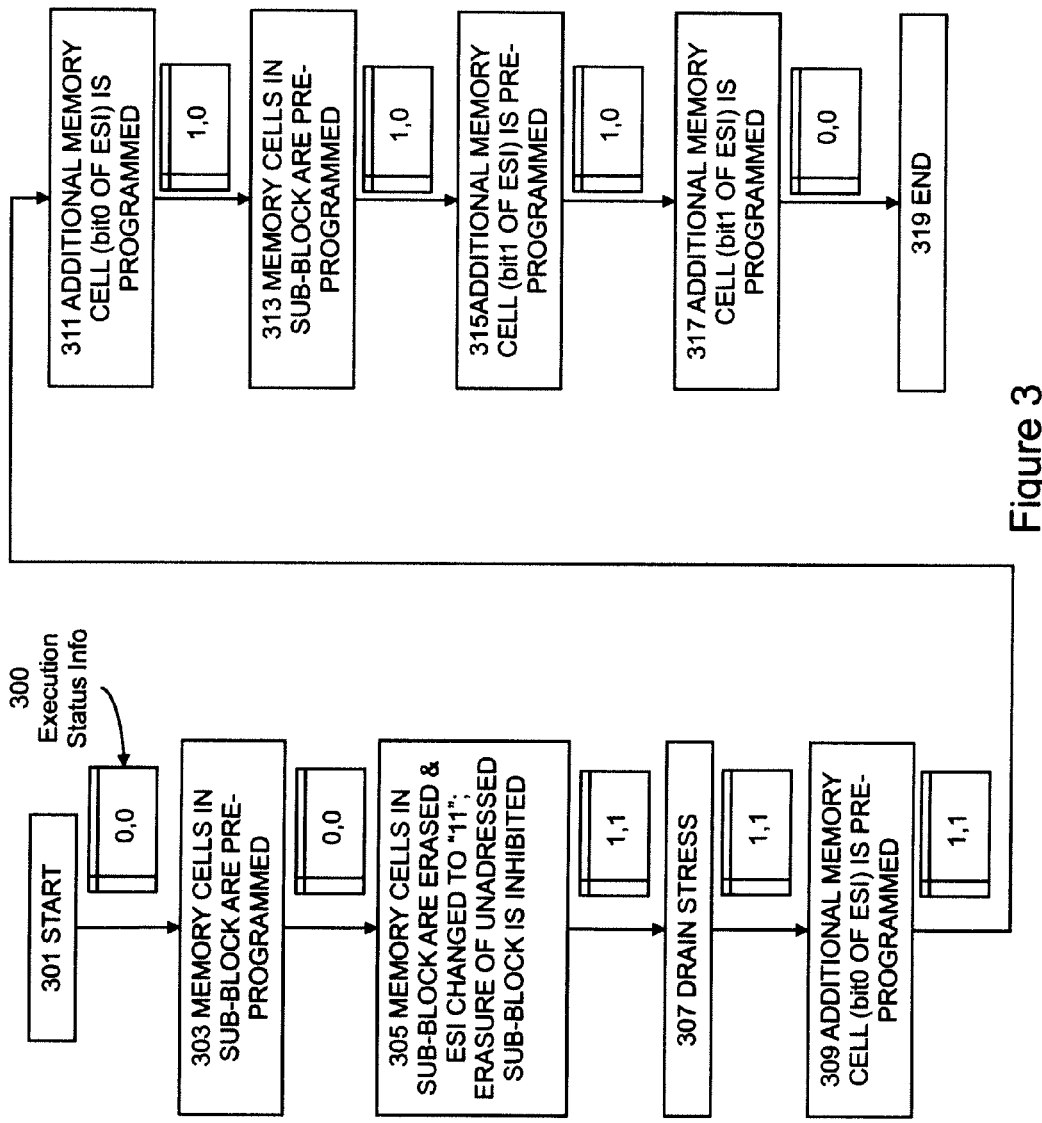
FIG. 3 illustrates an embodiment of a flow chart of a method for carrying out an erase operation.

FIG. 3 illustrates an embodiment of a flow of a method for carrying out an erase operation on a particular sub-block. In the example of FIG. 3, the erase operation is carried out without any interruption or power loss. In this embodiment, the additional information is stored as Execution Status Information (ESI) 300 which may be stored in the additional memory cells. When an addressed sub-block is erased, the ESI are also erased When other steps of the erase operation are carried out on the memory cells of the addressed sub-block, the content of the ESI may be changed and updated to reflect that a particular step has been completed and therefore does not need to be repeated if the erase operation is restarted because of power loss or erase suspend command receipt. On the contrary, the memory cells of unaddressed sub-blocks and ESI on corresponding additional Word Lines should not be affected by the erase operation on the addressed sub-block.

In another embodiment, the ESI may use more bits (i.e., in three fields) to increase reliability by multiple redundancy, and/or more than two bits or fields may be used to store more information and obtain a correspondingly higher resolution in defining the position in the flow at each moment of time and correspondingly allow a finer granularity of re-entry into the flow if necessary. In yet another embodiment, the additional information stored includes other details on the system operation, such as the number of program/erase cycles that a sub-block portion has undergone or other statistical information about the data content, the access to it, or the like.

The ESI 300 are shown next to each block of FIG. 3 at each stage during the erase operation. In the example of FIG. 3, the execution status of erase cycle is described according to the coding in the table below:

TABLE I execution status coding using 2 bits

| Bit 1 | Bit 0 | Execution Status |
|---|---|---|
| 1 | 1 | In the Erase and Verify phase |
| 1 | 0 | In the Soft-Programming phase |
| 0 | 0 | Not executing erase command |

The ESI track the progress in the erase flow of the corresponding addressed sub-block. Execution of the erasure may be restarted by reading the ESI after an interruption for example due to power loss or to the receipt of an erase suspend command for carrying out another access operation on a different portion of the memory, etc.

In this example, configuration (Bit 1, Bit 0)=(0, 1) is not valid. Of course, any other coding may be selected, i.e., exchanging the role of Bit 0 and Bit 1 or the value 0 and 1, etc.

At block 301, the erase cycle execution starts. At this point the ESI are (0, 0) which indicates that they were last updated at end of previous execution of erase command.

At block 303, memory cells in one sub-block are pre-programmed. This operation may not be performed, but its use obtains the same starting conditions and helps maintain a uniform wear-out of the memory cells within the block. After pre-programming, the ESI are (0, 0).

At block 305, memory cells in the addressed sub-block are erased. The additional memory cells of the additional Word Line associated to the sub-block are also erased. For example, with reference to FIG. 1, memory cells of addressed sub-block 125 (i.e., Word Lines 135(0) to 135(N−1)) are erased and ESI 300 on additional Word Line 145 is changed to "11", i.e. by an erase operation taking place at the same time. However, memory cells belonging to the unaddressed sub-block 123 (i.e., on Word Lines 133(0) to 133(N−1)) and corresponding additional Word Line 143 are not erased, so the ESI corresponding to the unaddressed sub-block is left in the (0, 0) configuration. At the end of this operation, the ESI corresponding to the addressed sub-block are =(1, 1).

In an embodiment, the erasing is achieved by applying a staircase-like voltage between the Word Lines in the addressed sub-block with respect to the underlying substrate. Between each step of the staircase-like voltage a verification of the state of the memory cells may be performed to decide when the erasing is completed.

Whether or not the erasing operation has been completed is determined by comparing the threshold voltage of the memory cells of the sub-block and additional Word Lines to a pre-defined threshold voltage value. If the threshold voltage of these memory cells is below the pre-defined threshold voltage value, then the erasing operation is complete.

In an embodiment, the Word Lines in unaddressed sub-blocks and their corresponding additional Word Lines are biased to an inhibition voltage with respect to the substrate to avoid or limit electric disturbances. The data content of the array portion accessible to the user is unchanged and the ESI corresponding to these unaddressed sub-blocks is also unchanged and normally is =(0, 0).

At block 307 a drain stress is applied to memory cells in the addressed sub-block. A positive voltage is applied to the Bit Lines of the sub-block while grounding the substrate and the Word Lines of the sub-block. About +1 to +3V is applied to the drain terminal while the control terminal is grounded. In one embodiment the Word Lines of the sub-block is biased at a slightly positive voltage +1 to +3V. To avoid undesired drain stress disturbance on unaddressed memory cells, i.e. those cells belonging to the sub-block portions not being erased, a slight negative voltage of about −1 to −3V is applied to the corresponding Word Lines.

This operation raises the threshold voltage of those memory cells that have been excessively erased to a depletion state. At the completion of the drain stress operation, the ESI of the addressed sub-block are (1, 1).

At block 309 additional memory cells corresponding to Bit 0 (first field) of the ESI are soft-programmed. If the threshold voltage of the additional memory cells Bit 0 is below a pre-defined value (typically ground voltage increased by a sufficient margin, e.g., 0.7V) the memory cells are soft-programmed by applying programming pulses of reduced amplitude to raise the threshold voltage above the pre-defined value while keeping it below the programmed value. At this point the ESI is still =(1, 1).

At block 311 memory cells corresponding to Bit 0 (first field) of additional information are programmed. The information on the progress in the execution of the erase command is now encoded, in the ESI. In particular, Bit 0 has been programmed.

At block 313 memory cells in the sub-block are soft-programmed. If the threshold voltage of the memory cells in the addressed sub-block is below a pre-defined value (typically ground voltage increased by a sufficient margin, e.g., 0.7V) the memory cells are soft-programmed by applying programming pulses of reduced amplitude to raise the threshold voltage above the pre-defined value while keeping it below the programmed value. At this point, the ESI is still (1, 0).

At block 315 memory cells corresponding to Bit 1 (second field) of additional information are soft-programmed. The same procedure described above is applied to the cells of Bit 1 and the ESI is (1, 0).

At block 317 memory cells corresponding to Bit 1 (second field) of additional information are programmed. The information on the progress in the execution of the erase command is now encoded. In particular Bit 1 has been programmed too so the ESI is (0, 0).

At block 319 execution of the erase command ends.

The ESI in additional memory cells is updated according to the progressing of the execution of the erase operation. In particular with the ESI of two bits (Bit 1, Bit 0) it is possible to discriminate among the following conditions: In the Erase and Verify phase (during or after block 305 and before block 309), In the Soft-Programming phase (between block 309 and block 317), and not executing erase command (after block 317 or before block 305). A higher level of detail may be available if more ESI are used and up-dated during the flow to store more information.

This additional information may be exploited to understand up to which point execution of the erase command has been carried out if an interruption occurs and resumption of the operation is desired.

It is pointed out that the exact sequence of the operations need not to be the one reported in FIG. 3 and described above; in particular some steps can be performed simultaneously, such as the soft programming of additional information memory cells described in blocks 309 and block 315 and/or even the soft programming of memory cells in the addressed sub-block as described in block 313 of FIG. 3, or the execution order can be inverted, i.e. block 313 may be executed after block 307 and before block 309, the rest of the flow being unchanged.

Figure 4:
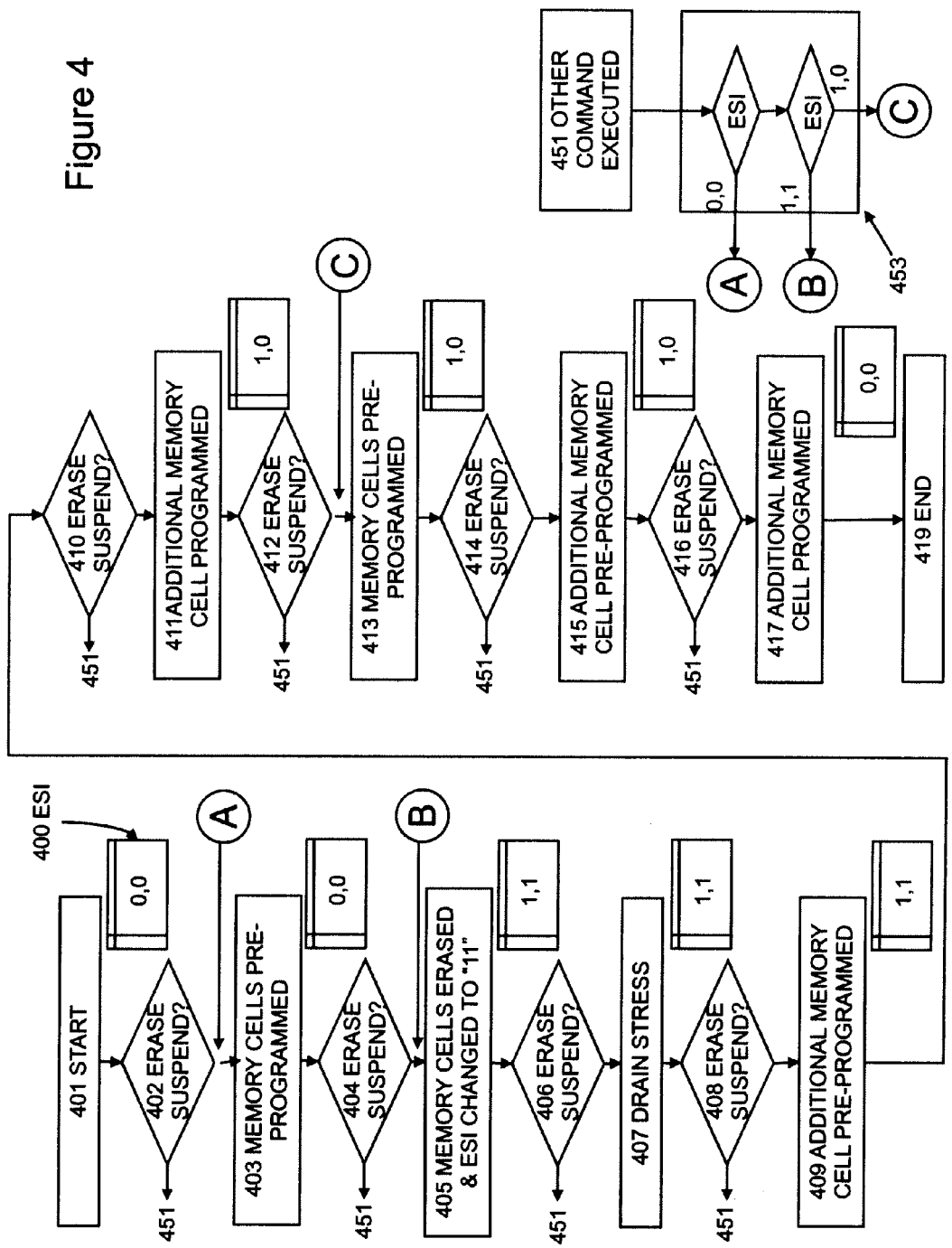
FIG. 4 illustrates an embodiment of a flow chart of a method for carrying out an erase operation including erase suspend capability.

FIG. 4 shows a block diagram schematically describing the execution of an erase command in one embodiment of the invention allowing for erase suspend capability.

The erase suspend command is usually issued by the memory controller when a read operation on the same memory partition or a program command addressing a different block in the array cannot be postponed to the end of the erase operation and therefore is executed during the execution of the erase command. As a matter of fact the latter operation has typically considerable time duration and the erase suspend feature allows to temporarily interrupt erase execution in order to execute the read or program command on a different address and subsequently to resume execution of the erase command.

FIG. 4 illustrates the flow of FIG. 3, with the addition of the branching points at blocks 402, 404, 406, 408, 410, 414, and 416 to block 451 when an erase suspend command is received. Accordingly, the detailed description of blocks corresponding to those in FIG. 3 is not repeated. The ESI 400 are shown next to each block of the flow chart of FIG. 4 at each stage during the erase operation.

At block 401 the command execution starts and the ESI= (0, 0)

At block 402 a check is performed to determine if an erase suspend command was received. If it was not, execution continues at block 403 and the ESI is (0.0). If an erase suspend command was received, execution is temporarily interrupted and the flow branches to block 451.

At block 403 memory cells in one sub-block are pre-programmed.

While this operation is not mandatory, its use helps to obtain the same starting conditions and maintain a uniform wear-out of the memory cells within the block. At this point the ESI is still (0, 0).

At block 404 a check is performed to determine if an erase suspend command was received. If it was not, execution continues at block 405. If an erase suspend command was received, execution is temporarily interrupted and the flow branches to block 451.

At block 405 memory cells in the sub-block are erased. The additional memory cells of the additional word line associated with the sub-block are also erased. However, the erasure of memory cells in unaddressed sub-blocks and corresponding additional Word Lines is inhibited. The ESI at this point is (1, 1).

At block 406 a check is performed to determine if an erase suspend command was received. If it was not, execution continues at block 407.

If erase suspend command was received, execution is temporarily interrupted and the flow branches to block 451.

Despite blocks 405 and block 406 being illustrated separately in FIG. 4, the execution of block 406 may be considered as embedded in the erase operation (block 405). For example, in one embodiment the check for the receipt of an erase suspend command is done whenever the verification of the state of the memory cells is performed. In another embodiment, as soon as the erase suspend command is received, any operation related to the erase operation is interrupted, the voltages applied to the terminals of the sub-block are brought to a safe level, and branching of the flow to block 451 occurs.

At block 407 a drain stress is applied to memory cells in the sub-block.

This is not mandatory, but it is useful to raise the threshold voltage of those memory cells that have been excessively erased to a depletion state. Drain stress on memory cells of unaddressed sub-sub-blocks may be inhibited. At this point this ESI is still (1, 1).

At block 408 a check is performed whether or not the erase suspend command was received. If it was not, execution continues with next step at block 409.

If erase suspend command was received, execution is temporarily interrupted and the flow branches to block 451.

At block 409 memory cells corresponding to a first field of the ESI are soft-programmed. At this point the ESI is still (1, 1).

At block 410 a check is performed to determine if an erase suspend command was received. If it was not, execution continues with at block 411.

If erase suspend command was received, execution is temporarily interrupted and the flow branches to block 451.

At block 411 memory cells corresponding to the first field of the ESI are programmed such that ESI is now (1, 0).

At block 412 a check is performed to determine if an erase suspend command was received. If it was not, execution continues with next step at block 413.

If an erase suspend command was received, execution is temporarily interrupted and the flow branches to block 451.

At block 413 memory cells in the sub-block are soft-programmed and the ESI is (1, 0).

At block 414 a check is performed to determine if an erase suspend command was received. If it was not, execution continues with next step at block 415.

If an erase suspend command was received, execution is temporarily interrupted and the flow branches to block 451.

At block 415 memory cells corresponding to a second field of the ESI are soft-programmed and the ESI is (1, 0).

At block 416 a check is performed to determine if an erase suspend command was received. If it was not, execution continues with next step at block 417.

If an erase suspend command was received, execution is temporarily interrupted and the flow branches to block 451.

At block 417 memory cells corresponding to the second field of the ESI are programmed making the ESI (0, 0).

At block 419 execution of the erase command ends.

At block 451 a read, program, or other command is executed on a different memory location during the erase suspension on the addressed sub-block. To perform such an operation the word lines of the sub-block under the erase suspend condition are biased to a negative voltage of about −1 to −4V, for example −3V, to switch off all the corresponding memory cells and therefore avoid an undesired current path due to depleted memory cells present in parallel to the cells to be read or programmed. Such a current path, if not switched off, may lead to a failure in the read or program operation on the different memory location. If branching to block 451 occurs from block 402 or from block 404 there is no need to bias the word lines of the sub-block at the negative voltage, as all the memory cells already have a positive threshold voltage.

When the operation that triggered the erase suspend command on the addressed sub-block is completed, execution continues at block 453, where the erase operation is resumed from the most appropriate re-entry point determined by using the ESI.

In one embodiment, the three re-entry points are provided: when the ESI (0, 0) re-entry occurs at A, that is at block 403 and the full erase operation is restarted; when the ESI (1, 1) re-entry occurs at B, that is at block 405 where erasing of memory cells in the sub-block is restarted (in practice this step is skipped without loss of time if erase verification is passed); and when ESI (Bit 1, Bit 0)=(1, 0) re-entry occurs at C, that is at block 413, where the cells in the sub-block are soft programmed and the flow continues thereof.

If more ESI are used a finer breakdown of the flow may be created and correspondingly there may be additional re-entry points, but in any case insuring appropriate erasure resumption at the operation completed before the erase suspend command was received.

Figure 5:
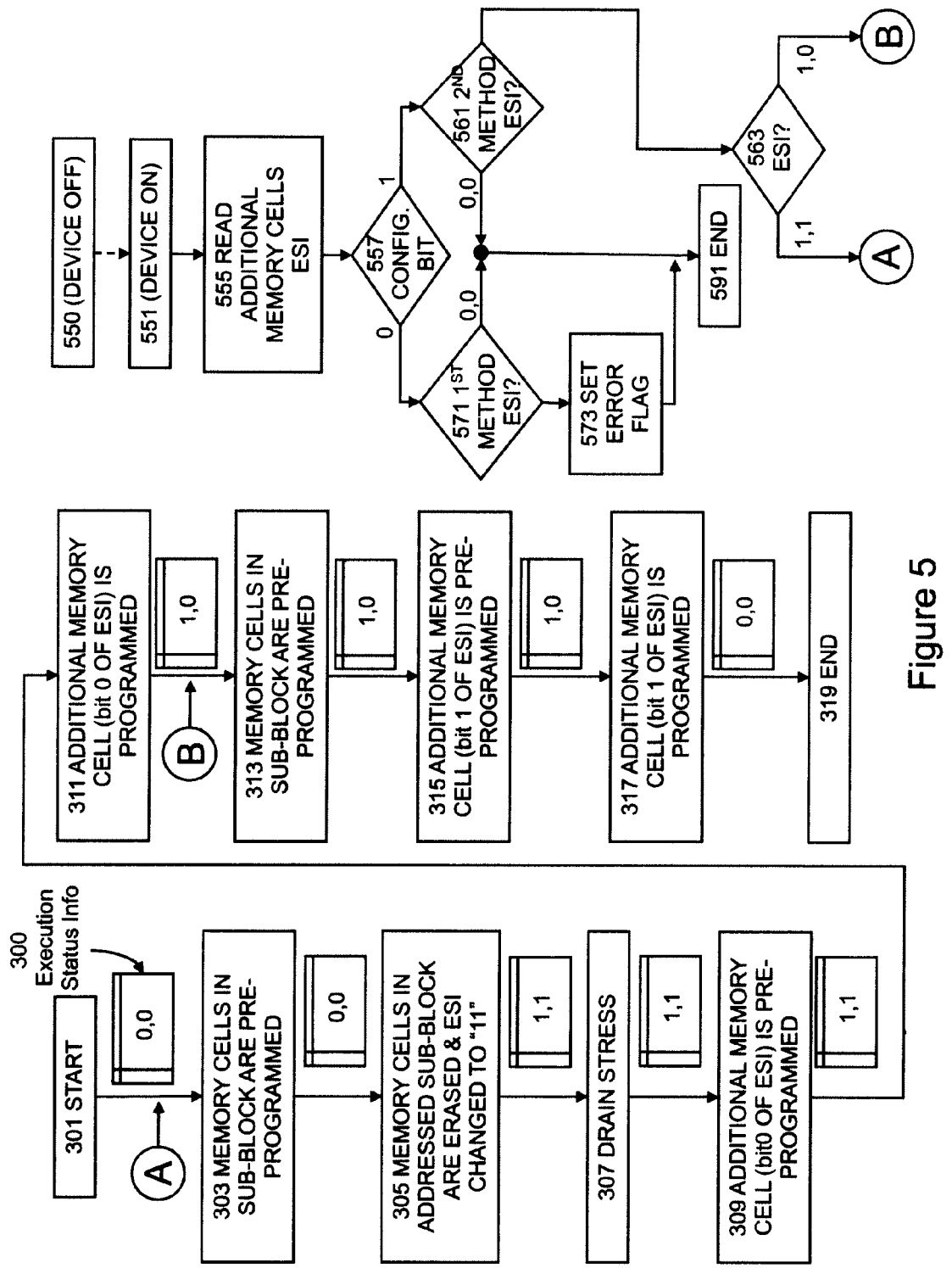
FIG. 5 illustrates an embodiment of a flow chart of a method for carrying out an erase operation in case of power loss and subsequent recovery.

FIG. 5 shows a block diagram schematically describing the operation during the execution of an erase command when a power loss occurs and the subsequent recovery according to one embodiment of the invention.

In the left side of FIG. 5 the basic flow already discussed with reference to FIG. 3 is illustrated with the same numerals and its description will not be repeated here.

The ESI are shown next to each block of the flow chart of FIG. 5 at each stage during the erase operation.

Power loss may occur at any time during execution of the sequence of operations. In such an event, the integrated circuit stops working and the operation remains incomplete.

This situation is illustrated in right side of FIG. 5 by block 550 which represents the "off" state of the integrated circuit. No explicit branching to block 550 is depicted in FIG. 5 because it can take place from any of the blocks in the left-hand flow-chart diagram.

In the right portion of FIG. 5 a block diagram of two possible recovery methods activated at a subsequent power on of the integrated circuit. A configuration bit is used to decide which of the two recovery methods will be executed. The configuration bit may be set by the user or during production or testing of the integrated circuit.

In an embodiment, only one of the two methods described below is implemented in the integrated circuit without loss of functionality. The corresponding modifications to the flow are obvious, i.e. there is no need for the configuration bit.

At block 551 the integrated circuit is powered on.

At block 555 the ESI related to a sub-block are read to retrieve the last updated status of the erase procedure.

At block 557 the configuration bit is read to decide which of the two recovery methods will to be executed.

If the configuration bit is in a first state, i.e. it is not active or 0, the execution branches to block 571 to follow the first recovery method, while if the configuration bit is in a second state, i.e. it is active or 1, the execution branches to block 561 to follow the second recovery method.

At block 571 a conditional branch is performed according to the content of the previously read. More specifically if the ESI is (0, 0) then the status corresponds to a situation such that no problem occurred during the erasure, and execution continues to block 591 that ends the recovery method and the integrated circuit is ready to accept any other command. Note that the information related to all sub-blocks read at block 555 is processed before the device operation continues.

If the content of the ESI configuration is not different from (0, 0) then the status corresponds to a situation such that a power down occurred during the erase, and execution continues to block 573.

At block 573 an error flag is set and the corresponding information may be made available to the user by outputting one or more bits, e.g., the error flag bit, the content of the status bits, the address of the sub-block that underwent the error, etc., so that the user may decide how to proceed.

The execution of the recovery method then comes to an end at block 591.

If the configuration bit is active, from block 557 execution branches to block 561 to follow a second recovery method.

At block 561 a conditional branch is performed according to the content of the ESI. More specifically, if the (0, 0) then the status corresponds to a situation such that no problem occurred during the erasure, and execution continues to block 591 that ends the recovery method and the integrated circuit is now ready to accept any other command.

If the content is different than (0, 0) then the status corresponds to a situation such that power down occurred during the erase and execution continues at block 563.

At block 563 a conditional branch is performed according to the ESI. More specifically, if the ESI configuration is (1, 1) then the status corresponds to a situation such that a power down occurred during preliminary stages of the erase operation, typically up to but before full completion of the erase at block 305, and in any case before block 311 when ESI corresponding to bit 0 (first field) is programmed. Correspondingly, complete recovery of the erase operation is necessary and execution resumes with pre-programming of cells in the sub-block at block 303—in FIG. 5 this is shown by re-entry point A in the basic flow diagram on the left side.

If the ESI configuration is (1, 0) then the status corresponds to a situation such that a power down occurred during the final stages of the erase operation, after full completion of the erase at block 305 and drain stress at block 307, but before completion of soft-programming of memory cells in the sub-block at block 311. Correspondingly, recovery of the erase operation is restarted from that point and execution resumes with soft-programming of cells in the sub-block at block 311—in FIG. 5 this is shown by re-entry point B in the basic flow diagram on the left side.

The embodiments depicted in FIGS. 4 and 5 and/or those described above may be combined with each other. In either case the amount of ESI information stored in the additional memory cells may allow a finer granularity of the re-entry point in the main flow.

Figure 6:
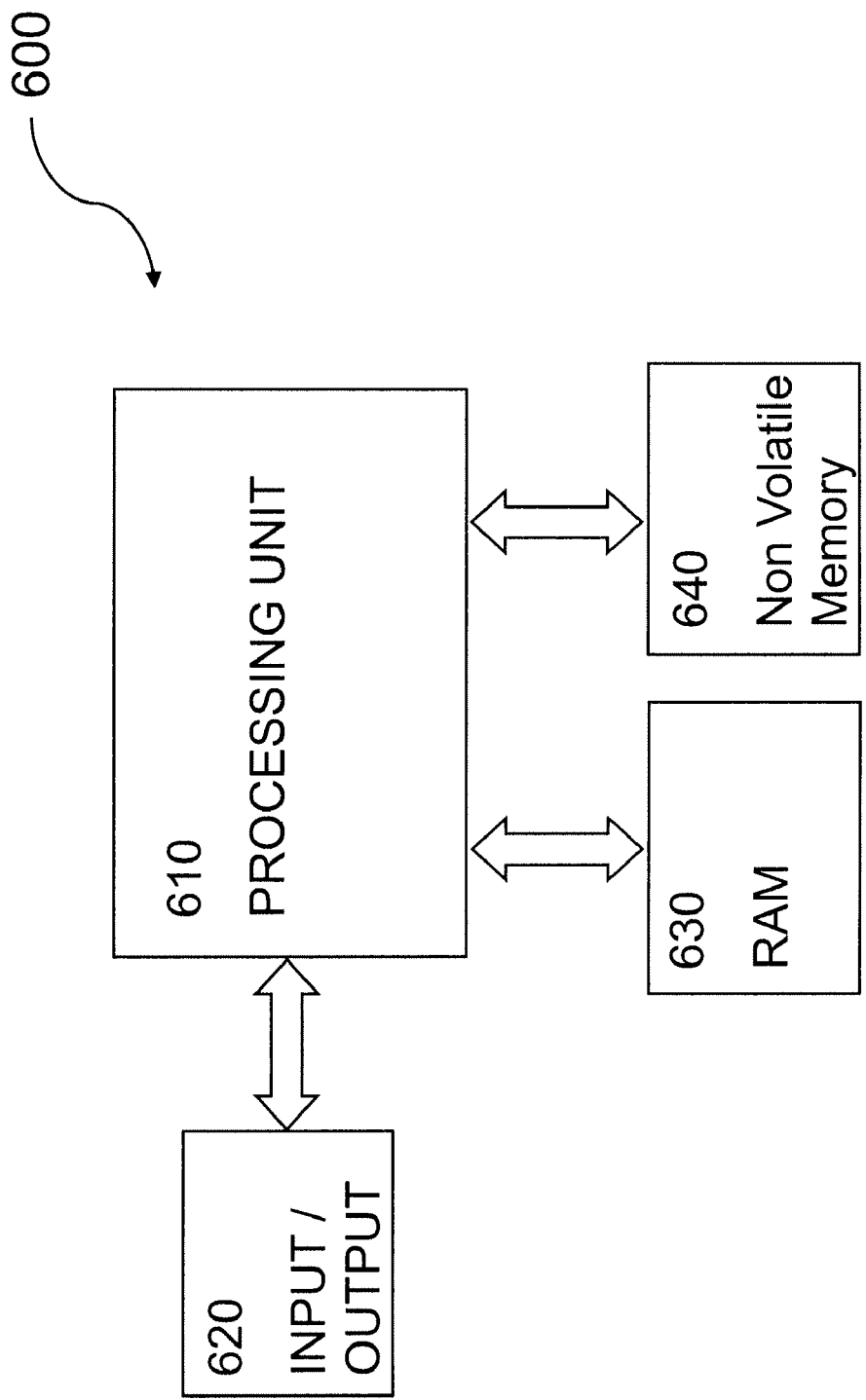
FIG. 6 is a schematic view of a system according to one embodiment.

FIG. 6 illustrates an embodiment of a system utilizing embodiments of the invention described above. A mobile phone apparatus 600 including a processing unit block 610 to manage the device functionality is shown. Processing unit block 610 may comprise, for example, one or more microprocessors, digital signal processors, micro-controllers, or the like.

The processing unit block 610 is coupled with an Input/Output unit 620, such as a keyboard, a display, a microphone/speaker, and/or a RF unit to drive an antenna. The I/O unit 620 may be used to generate or to visualize/reproduce a message.

The processing unit block 610 is also coupled to a memory block 630, to provide fast access to/from data stored therein, and with a non-volatile memory block 640, to store programs and data. The non-volatile memory block 640 embodies one of the embodiments of the invention. RAM block 630 and non volatile memory block 640 may be used to store messages transmitted to or by system 600. They may also be used to store instructions that are executed by processing unit 610 during the operation of system 600 and may be used to store user data.

A battery, not shown in FIG. 6, may supply power to the system 600 in one embodiment.

Although in the foregoing description reference has been made to memory cells having the structure of stacked-gate transistors, the present invention also applies to other types of memory cells, such as memory cells in which the floating gate is replaced by a charge trapping layer in the cell dielectric under the control gate, for example, a nitride layer in an oxide-nitride-oxide layer stack.

Moreover, without any limitation to the invention, each memory cell may store more than one bit of information; as an example in one embodiment each memory cell stores 2 bits. The present invention has been disclosed and described by way of some embodiments; however it is apparent to those skilled in the art that several modifications to the described embodiments, as well as other embodiments of the present invention are possible without departing from the scope thereof as defined in the appended claims.

I claim:

1. A method comprising:
   selectively erasing only a first plurality of memory cells of
      a first portion of a NOR block, wherein the NOR block includes,
      the first portion including a first plurality of Word-Lines associated with the first plurality of memory cells,
      a second portion including a second plurality of memory cells and a second plurality of Word-Lines, wherein the first and second plurality of memory cells are separately addressable, and the first and second portions share a physical semiconductor substrate; and
      a first memory to store execution status information associated with the first plurality of memory cells, wherein the first memory comprises at least two memory cells on a word line that is independent of the first and second portions of the NOR block and shares the physical semiconductor substrate with the first and second portions of the NOR block; and
   updating the execution status information to reflect a status of the erasing only the first plurality of memory cells.

2. The method of claim 1, wherein the selective erasing only memory cells of the first portion of the NOR block comprises:
   biasing the first plurality of Word-Lines to an erase voltage, and
   biasing the second plurality of Word-Lines to an inhibition voltage.

3. The method of claim 2, further comprising:
   analyzing the execution status information upon an occurrence of an event to determine an action to perform.

4. The method of claim 3, wherein the event is a loss of power to the NOR block.

5. The method of claim 3, wherein the event is an erase suspend request.

6. The method of claim 3, further comprising:
   re-executing a last completed action responsive to the execution status information being set to a first value out of a plurality of values.

7. The method of claim 3, further comprising:
   performing a pre-programming operation if the event is an erase suspend request and the execution status information indicates an interruption occurred before the start of an erase operation;
   resuming erasing only memory cells of the first plurality of Word-Lines from an erase operation if the execution status information indicates an interruption before a start of a soft-programming operation;
   resuming erasing only memory cells of the first plurality of Word-Lines from a soft-programming operation if the execution status information indicates an interruption before completion of a soft-programming operation; and
   setting a failure indicator if the event is a loss of power.

8. An apparatus comprising:
   a first portion of a NOR block, wherein the first portion includes a first plurality of memory cells;
   a second portion of the NOR block, wherein the second portion includes a second plurality of memory cells that are independently addressable from the first plurality of memory cells and wherein the first and the second portions share a physical semiconductor substrate of the NOR block; and
   a first memory to store execution status information associated with the first plurality of memory cells to reflect an erase status of the first plurality of memory cells, wherein the first memory comprises at least two memory cells on a word line that is independent of the first and second portions of the NOR block and shares the physical semiconductor substrate with the first and second portions of the NOR block.

9. The apparatus of claim 8, wherein the first plurality of memory cells are on first plurality of word lines and the second plurality of memory cells are on second plurality of word lines.

10. The apparatus of claim 8, further comprising:
    a second memory to store execution status information associated with the second plurality of memory cells to reflect an erase status of the second plurality of memory cells.

11. The apparatus of claim 8, wherein the first memory to store execution status information is on a physical substrate different from the NOR block.

12. The apparatus of claim 9, further comprising:
    a correspondence table to describe a relationship between the word lines of the NOR block and the first and second portions.

13. The apparatus of claim 12, wherein a relative position of the first plurality of word lines and of the second plurality of word lines is modifiable by changing the relationship stored in the correspondence table.

14. The apparatus of claim 12, wherein a relative size of the first and the second portions is modifiable by changing the relationship stored in the correspondence table.

15. The apparatus of claim 8, wherein the first plurality of memory cells are on adjacent word lines.

16. The apparatus of claim 8, wherein the first plurality of memory cells have a spatially random distribution within the NOR block.

17. A system comprising:
   a processor; and
   a non-volatile memory coupled to the processor, wherein the non-volatile memory includes:
      a first portion of a NOR block, wherein the first portion includes a first plurality of memory cells;
      a second portion of the NOR block, wherein the second portion includes a second plurality of memory cells that are independently addressable from the first plurality of memory cells and wherein the first and the second portions share a physical semiconductor substrate of the NOR block; and
      a first memory to store execution status information associated with the first plurality of memory cells to reflect an erase status of the first plurality of memory cells, wherein the first memory comprises at least two memory cells on a word line that is independent of the first and second portions of the NOR block and shares the physical semiconductor substrate with the first and second portions of the NOR block.

18. The system of claim 17, wherein the first memory to store execution status information associated with the first plurality of memory cells comprises:
   at least two memory cells on a word line that is independent of the first and second portions of the NOR block and shares the physical substrate of with the first and second portions of the NOR block.

19. The system of claim 17, wherein the first plurality of memory cells are on first plurality of word lines and the second plurality of memory cells are on second plurality of word lines.

20. The system of claim 8, wherein the first and second portions of the NOR block and the first memory are included in a single memory array.

* * * * *